(12) United States Patent
Saiki

(10) Patent No.: US 7,221,009 B2
(45) Date of Patent: May 22, 2007

(54) SEMICONDUCTOR DEVICE

(75) Inventor: Takashi Saiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/273,993

(22) Filed: Oct. 21, 2002

(65) Prior Publication Data
US 2003/0178685 A1 Sep. 25, 2003

(30) Foreign Application Priority Data
Mar. 19, 2002 (JP) ............................ 2002-077218

(51) Int. Cl.
H01L 31/112 (2006.01)
(52) U.S. Cl. ...................... 257/264; 438/232
(58) Field of Classification Search ............... 438/199, 438/231, 232, 303, 305, 307; 257/369, 371, 257/373, 408, 358, 264
See application file for complete search history.

(56) References Cited

U.S. PATENT DOCUMENTS

| | | | | |
|---|---|---|---|---|
| 4,956,311 | A * | 9/1990 | Liou et al. ................... | 438/231 |
| 5,516,711 | A * | 5/1996 | Wang .......................... | 438/217 |
| 5,759,901 | A * | 6/1998 | Loh et al. .................... | 438/305 |
| 5,783,457 | A * | 7/1998 | Hsu ............................. | 438/302 |
| 5,849,616 | A * | 12/1998 | Ogoh ......................... | 438/231 |
| 5,933,741 | A * | 8/1999 | Tseng ......................... | 438/305 |
| 5,956,584 | A * | 9/1999 | Wu ............................. | 438/232 |
| 5,960,319 | A * | 9/1999 | Iwata et al. ................. | 438/664 |
| 6,074,915 | A * | 6/2000 | Chen et al. ................. | 438/258 |
| 6,087,210 | A * | 7/2000 | Sohn ........................... | 438/217 |
| 6,124,177 | A * | 9/2000 | Lin et al. .................... | 438/305 |
| 6,133,082 | A * | 10/2000 | Masuoka .................... | 438/227 |
| 6,165,827 | A * | 12/2000 | Ahmad et al. .............. | 438/231 |
| 6,261,888 | B1 * | 7/2001 | Dennison et al. .......... | 438/231 |
| 6,300,206 | B1 * | 10/2001 | Fukada et al. .............. | 438/303 |
| 6,342,422 | B1 | 1/2002 | Wu | |
| 6,432,781 | B2 * | 8/2002 | Wasshuber .................. | 438/289 |

(Continued)

FOREIGN PATENT DOCUMENTS

JP 05-326552 12/1993

(Continued)

OTHER PUBLICATIONS

Richard S. Muller et al., "Device Electronics for Integrated Circuits", 2nd ed., John Wiley & Sons, (c) 1986, pp. 85.*

(Continued)

Primary Examiner—W. David Coleman
(74) Attorney, Agent, or Firm—Westerman, Hattori, Daniels & Adrian, LLP.

(57) ABSTRACT

A dose of arsenic for an extension region in an NMOS transistor is in a range from $5\times10^{14}$ to $2\times10^{15}$ ions/cm² and preferably in a range from $1.1\times10^{15}$ to $1.5\times10^{15}$ ions/cm². Also, in addition to arsenic, a low concentration of phosphorus is doped into the extension region by ion implantation. Consequently, with a semiconductor device of the CMOS structure, it is possible to prevent unwanted creeping of silicide that occurs often in the shallow junction region depending on a concentration of an impurity having a low diffusion coefficient as represented by arsenic. Further, not only can the resistance in the shallow junction region be lowered, but also an amount of overlaps can be optimized in each transistor.

17 Claims, 12 Drawing Sheets

U.S. PATENT DOCUMENTS

| | | | |
|---|---|---|---|
| 6,518,136 B2 * | 2/2003 | Lee et al. | 438/303 |
| 2002/0039819 A1 * | 4/2002 | Curello et al. | 438/231 |
| 2002/0042173 A1 * | 4/2002 | Takamura | 438/199 |
| 2002/0182757 A1 * | 12/2002 | Conchieri et al. | 438/7 |

FOREIGN PATENT DOCUMENTS

| | | |
|---|---|---|
| JP | 07-111328 | 4/1995 |
| JP | 7-147397 | 6/1995 |
| JP | 08-255903 | 10/1996 |
| JP | 10-012870 | 1/1998 |
| JP | 11-186188 | 7/1999 |
| JP | 2000-307113 | 11/2000 |
| JP | 2001-267431 | 9/2001 |
| JP | 2001-339062 | 12/2001 |
| JP | 2002-026318 | 1/2002 |

OTHER PUBLICATIONS

Wolf et al., "Silicon Processing for the VLSI Era, vol. 1, Process Technology", Sunset Press, 1986, pp. 290-291.*

Japanese Office Action dated May 9, 2006 (mailing date), issued in corresponding Japanese Patent Application No. 2002-077218.

* cited by examiner

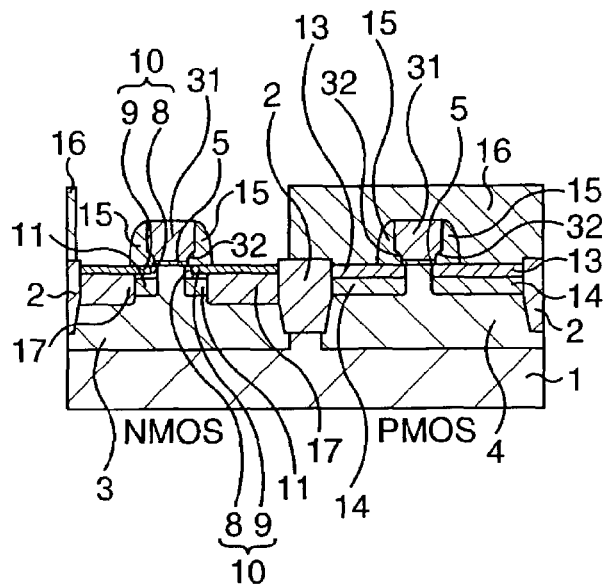

SEMICONDUCTOR DEVICE

CROSS-REFERENCE TO RELATED APPLICATIONS

This application is based upon and claims priority of Japanese Patent Application No. 2002-077218, filed on Mar. 19, 2002, the contents being incorporated herein by reference.

BACKGROUND OF THE INVENTION

1. Field of the Invention

The present invention relates to a semiconductor device and a manufacturing method thereof, which are particularly suitable for salicide CMOS transistor applications.

2. Description of the Related Art

Advancements in miniaturization and speedups of a semiconductor device in recent years have been increasing the need for a high-performance and low-power-consumption transistor. In order to meet such a need, it is crucial to solve a problem of wiring delay by lowering the resistance of various wires. To this end, for example, a so-called silicide structure, and further, a so-called salicide structure are adopted in a CMOS transistor or the like.

The salicide structure is achieved by depositing metal, which is commonly W or Co, on the gate and the impurity diffusion layer followed by sintering, thereby allowing silicon and the metal to react with each other. In this case, in order to prevent shorting the gate to the impurity diffusion layer through the silicide film, a sidewall is formed to electrically isolate the gate and the impurity diffusion layer. Also, the impurity diffusion layer is formed so that a shallow junction region (extension region) and a deep junction region (source/drain region) overlap by performing ion implantation twice before and after the formation of the sidewall.

According to the salicide structure described above, an impurity concentration in the extension region tends to increase to meet the need to further lower the resistance. A CMOS transistor commonly uses boron (B) having a high diffusion coefficient as an impurity for a PMOS transistor, and arsenic (As) having a low diffusion coefficient for an NMOS transistor. When a dose of arsenic is increased to lower the resistance in the extension region and to ensure the overlaps with the gate in the NMOS transistor, it becomes difficult to optimize an amount of overlaps in each transistor. Further, a higher concentration of arsenic in the extension region of the NMOS transistor gives rise to unwanted creeping of metal silicide into the semiconductor substrate, which poses a problem that the gate shorts to the source/drain.

SUMMARY OF THE INVENTION

The present invention is devised to solve the above problems, and therefore, has an object to provide a semiconductor device of a CMOS structure, with which it is possible to prevent unwanted creeping of silicide that occurs often in a shallow junction region depending on a concentration of an impurity having a low diffusion coefficient as represented by arsenic, and further, not only can the resistance in the shallow junction region be lowered, but also an amount of overlaps can be optimized in each transistor, and a manufacturing method thereof.

The inventor of the present invention conduced an assiduous study and achieved embodiments as follows.

The present invention is according to a semiconductor device of a so-called CMOS structure, that is, a semiconductor device including a first transistor having a first impurity diffusion layer of a first conduction type formed in such a manner that a shallow junction region and a deep junction region overlap each other at least partially, and having a silicide layer formed at least on a surface of the first impurity diffusion layer; and a second transistor having a second impurity diffusion layer of a second conduction type, the first conduction type and the second conduction type being opposite to each other, and to a manufacturing method thereof.

A semiconductor device according to an aspect of the present invention is arranged in such a manner that a first impurity doped into the shallow junction region in the first impurity diffusion layer has a diffusion coefficient lower than a diffusion coefficient of a second impurity doped into the second impurity diffusion layer, and an impurity concentration in the shallow junction region is in a range from $1.1\times10^{15}$ to $2\times10^{15}$ ions/cm$^2$.

Also, a semiconductor device according to another aspect of the present invention is arranged in such a manner that it has a so-called double-sidewall structure, and that a first impurity doped into the shallow junction region in the first impurity diffusion layer has a diffusion coefficient lower than a diffusion coefficient of a second impurity doped into the second impurity diffusion layer, and an impurity concentration in the shallow junction region is in a range from $5\times10^{14}$ to $2\times10^{15}$ ions/cm$^2$.

Further, a semiconductor device according to a further another aspect of the present invention is arranged in such a manner that it has a so-called notch gate structure, and that a first impurity doped into the shallow junction region in the first impurity diffusion layer has a diffusion coefficient lower than a diffusion coefficient of a second impurity doped into the second impurity diffusion layer, and an impurity concentration in the shallow junction region is in a range from $5\times10^{14}$ to $2\times10^{15}$ ions/cm$^2$.

BRIEF DESCRIPTION OF THE DRAWINGS

FIGS. 5A through 5I are schematic cross sections showing a fabrication sequence in a manufacturing method of a CMOS transistor according to a third embodiment.

DETAILED DESCRIPTION OF THE PREFERRED EMBODIMENTS

1. Principle of Operations of the Present Invention

Figure 1:
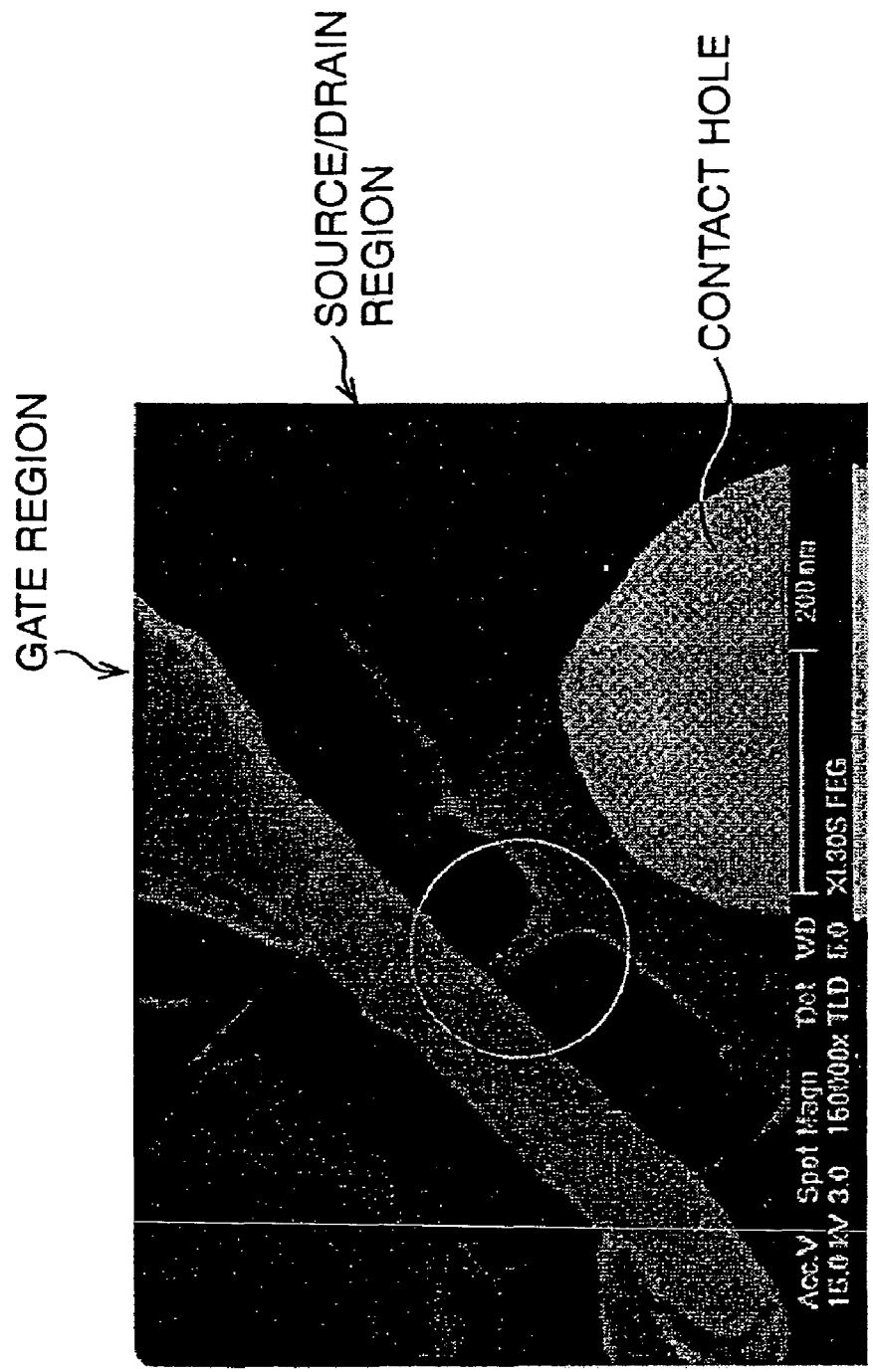
FIG. 1 is a figure corresponding to photomicrograph showing a short of a gate to a source/drain caused by creeping of silicide in a substrate.

In a semiconductor device of a CMOS structure, in case that a dose of arsenic used in forming an extension region of an NMOS transistor is increased to as high as $3\times10^{15}$ ions/cm$^2$, it is confirmed that, as shown in FIG. 1, the gate shorts to the source/drain due to creeping of silicide in the substrate.

Hence, the present invention is addressed to limit a dose of arsenic for the extension region.

Figure 2:
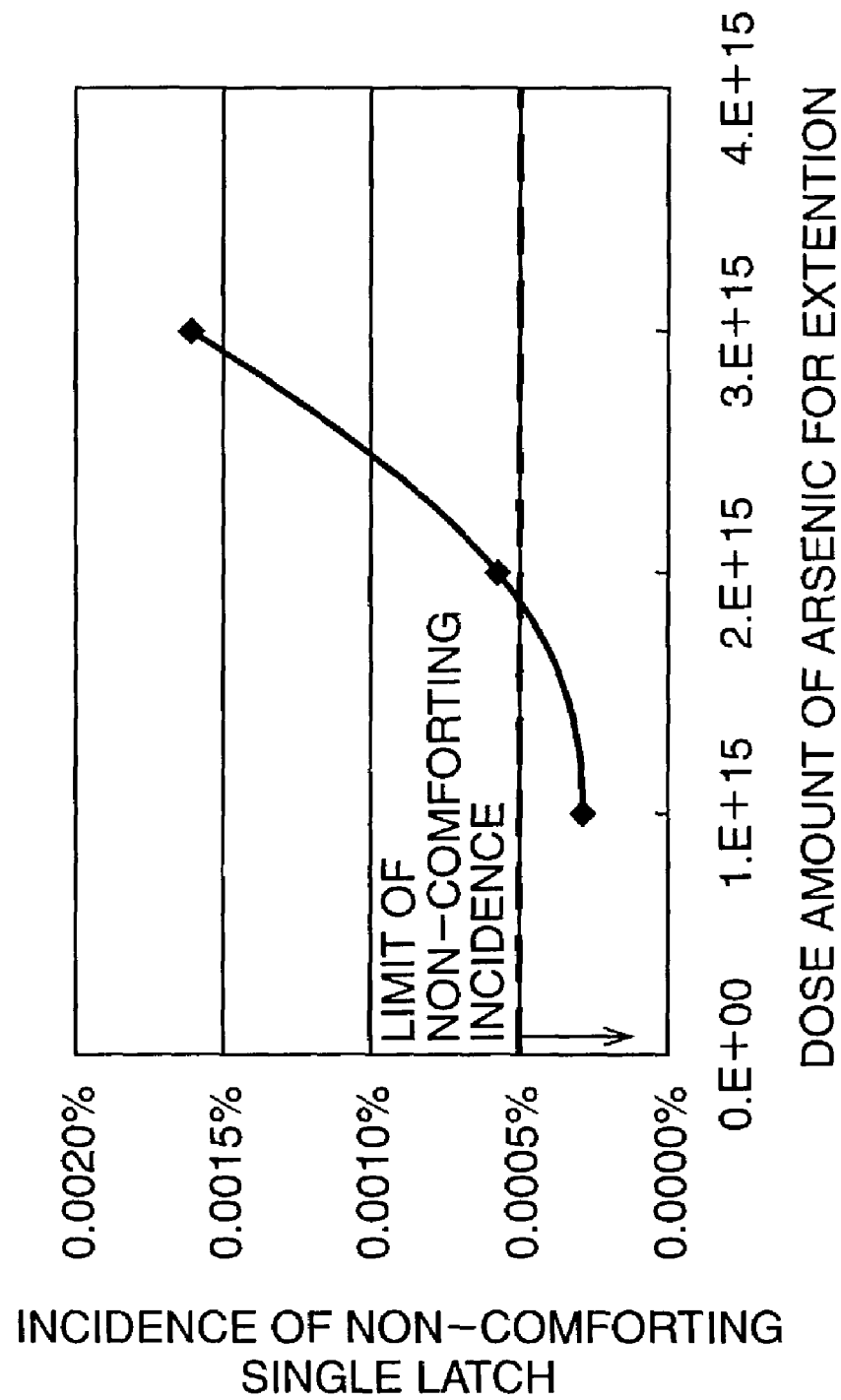
FIG. 2 is a characteristic view showing an analyzed relation between a dose of arsenic for an extension region and incidence of non-conforming transistors.

FIG. 2 shows a characteristic view showing an analyzed relation between a dose of arsenic for the extension region and incidence of non-comforting transistors. Given approximately 0.0005% as the limit of incidence of non-conformity by taking miscellaneous conditions into account, then the upper limit of a dose of arsenic is estimated to be $2\times10^{15}$ ions/cm$^2$ approximately, and preferably $1.5\times10^{15}$ ions/cm$^2$ approximately. By taking the need to lower the resistance in the extension region into account, the lower limit of a dose of arsenic is estimated to be $5\times10^{14}$ ions/cm$^2$ approximately, and preferably $1.1\times10^{15}$ ions/cm$^2$ approximately.

From the foregoing estimations, an appropriate dose of arsenic that satisfies both the needs to (1) lower the incidence of non-conformity (to prevent a reduction of yields) and (2) lower the resistance in the extension region is in a range from $5\times10^{14}$ to $2\times10^{15}$ ions/cm$^2$, and preferably in a range from $1.1\times10^{15}$ to $1.5\times10^{15}$ ions/cm$^2$. Further, by stressing the need to lower the resistance in the extension region of the NMOS transistor in view of the importance, the appropriate range may be from $1.1\times10^{15}$ to $2\times10^{15}$ ions/cm$^2$.

In this case, in addition to the ion implantation of arsenic in the above-specified appropriate range, a low concentration of phosphorus may be doped into the extension region of the NMOS transistor by ion implantation, so that the concentration of an n-type impurity in the extension region is adjusted high. Consequently, it is possible to further lower the resistance in the extension region and optimize an amount of overlaps in each of the PMOS transistor and the NMOS transistor without interfering with prevention of a reduction of yields of the transistor.

2. Preferred Embodiments of the Present Invention

The following description will describe in detail concrete embodiments of the present invention with reference to the drawings based on the principle of operations of the present invention described above.

(First Embodiment)

Initially, an explanation will be given to a first embodiment. Herein, a CMOS transistor of the salicide structure is used as an example of the semiconductor device. For ease of explanation, a structure of the CMOS transistor will be described in parallel with a manufacturing method thereof.

FIGS. 3A through 3I are schematic cross sections showing a fabrication sequence in the manufacturing method of the CMOS transistor according to the first embodiment.

Figure 3A:
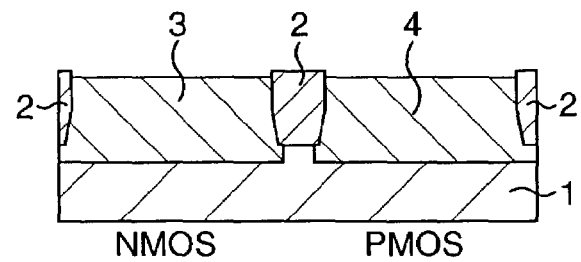
FIGS. 3A through 3I are schematic cross sections showing a fabrication sequence in a manufacturing method of a CMOS transistor according to a first embodiment.

As shown in FIG. 3A, the manufacturing of the CMOS transistor starts with the formation of trenches in a p-type semiconductor substrate 1 by patterning an isolation region, and a silicon oxide film is deposited on the entire surface by the CVD method in a film thickness sufficient to bury the trenches, after which the surface layer of the silicon oxide film is polished by the chemical mechanical polishing method (CMP method), whereby STI isolation structures 2 are formed by filling the trenches with the silicon oxide film. Consequently, active regions are defined.

Subsequently, the active region on the left side of the STI isolation structure 2 at the center in FIG. 3A is made into a p-type channel/well region 3 by doping a p-type impurity, that is, boron (B) herein, by ion implantation, and the active region on the right side is made into an n-type channel/well region 4 by doping an n-type impurity, that is, phosphorus (P) herein. In the following steps, an NMOS transistor and a PMOS transistor are fabricated in the p-type channel/well region 3 and the n-type channel/well region 4, respectively.

Figure 3B:
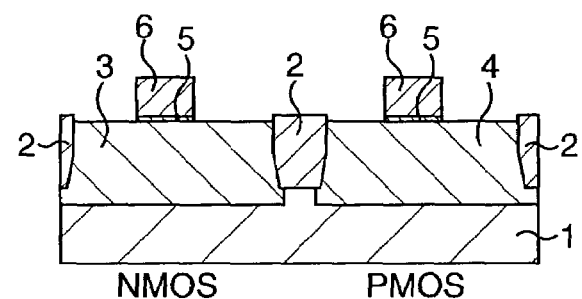

Then, as shown in FIG. 3B, a gate insulation film 5 is formed over the p-type channel/well region 3 and the n-type channel/well region 4 by, for example, thermal oxidation, and a polycrystalline silicon film is deposited on the entire surface by the CVD method, after which the polycrystalline silicon film and the gate insulation film 5 are patterned, whereby a gate electrode 6 is formed on each of the p-type channel/well region 3 and the n-type channel/well region 4 with the gate insulation film 5 being interposed therebetween.

Figure 3C:
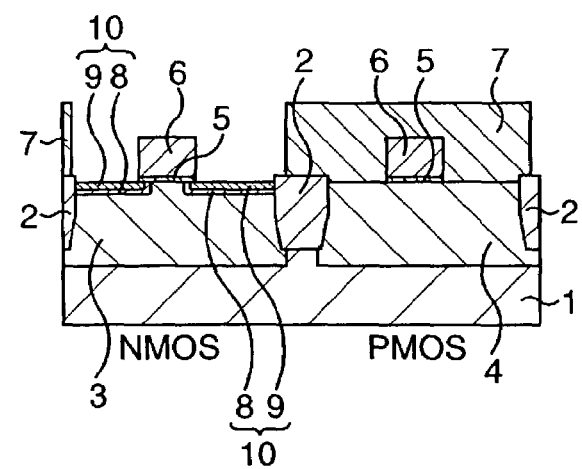
Figure 3D:
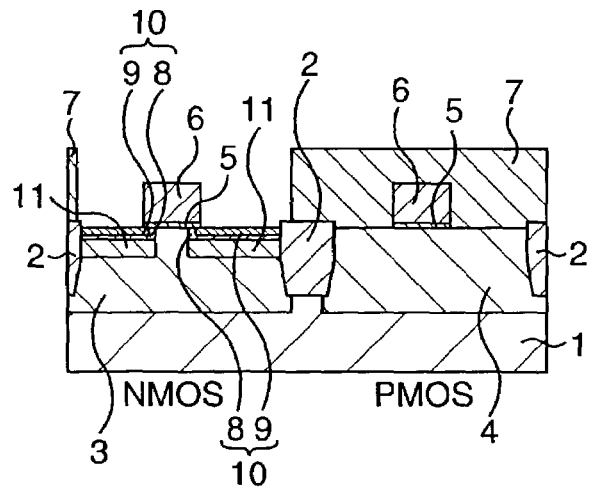

Subsequently, as shown in FIGS. 3C and 3D, a shallow junction region and its pocket layer are formed in the p-type channel/well region 3 alone.

To be more specific, as shown in FIG. 3C, a resist pattern 7 is formed by processing to cover only the n-type channel/well region 4, and a junction layer 8 is formed by doping a high concentration of an n-type impurity, that is, arsenic (As) herein, into the surface layer of the semiconductor substrate 1 on either side of the gate electrode 6 by ion implantation using the resist pattern 7 and the gate electrode 6 on the p-type channel/well region 3 as a mask. The ion implantation conditions for arsenic at this point may be as follows: the acceleration energy is 5 keV, and a dose is within the above-specified appropriate range.

Then, a junction layer 9 is formed by doping, in succession to the ion implantation of arsenic, a low concentration of an n-type impurity, that is, phosphorus (P) herein, by ion implantation using the resist pattern 7 and the gate electrode 6 as a mask again to compensate for a further higher n-type impurity concentration. The ion implantation conditions for phosphorus at this point may be as follows: the acceleration energy is 1 keV, and a dose is $5\times10^{13}$ ions/cm$^2$. By performing the ion implantation twice in this manner, the junction layer 9 overlaps the junction layer 8, whereby a shallow junction region (extension region) 10 adjusted to have a desired high concentration is formed.

Then, as shown in FIG. 3D, a pocket layer 11 is formed by doping a p-type impurity, that is, boron (B) or indium (In) herein, by ion implantation using the resist pattern 7 and the gate electrode 6 as a mask once again. At this point, the ion implantation is performed with a tilt angle of 0° or in a slanting direction with respect to a direction perpendicular to the surface of the semiconductor substrate 1.

Figure 3E:
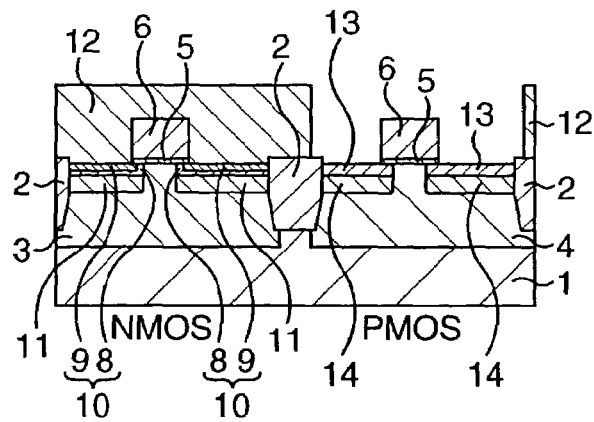

Subsequently, after the resist pattern 7 is removed by ashing or the like, as shown in FIG. 3E, a shallow junction region and its pocket layer are formed next in the n-type channel/well region 4 alone.

To be more specific, a resist pattern 12 is formed by processing to cover only the p-type channel/well region 3, and a high concentration of a p-type impurity, that is, boron herein, is doped into the surface layer of the semiconductor substrate 1 on either side of the gate electrode 6 by ion implantation using the resist pattern 12 and the gate electrode 6 on the n-type channel/well region 4 as a mask. Consequently, an extension region 13 is formed.

Then, a pocket layer 14 is formed by doping an n-type impurity, that is, arsenic herein, by ion implantation using the resist pattern 12 and the gate electrode 6 as a mask again. At this point, the ion implantation is performed with a tilt angle of 0° or in a slanting direction with respect to a direction perpendicular to the surface of the semiconductor substrate 1.

Figure 3F:
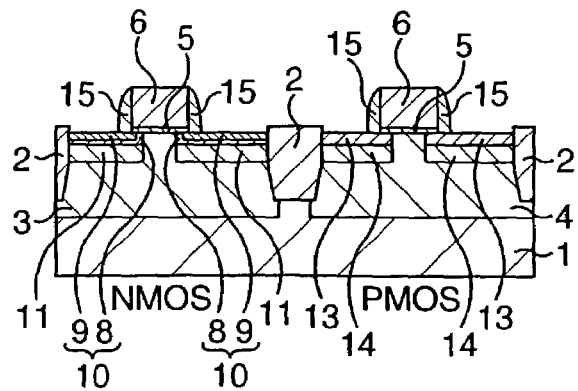

Subsequently, after the resist pattern 12 is removed by ashing or the like, as shown in FIG. 3F, a silicon oxide film is deposited on the entire surface by the CVD method to cover each gate electrode 6, and the entire silicon oxide film is subjected to anisotropic etching (etched back) so that the silicon oxide film is left only on the side face of each gate electrode 6, whereby sidewalls 15 are formed.

Figure 3G:
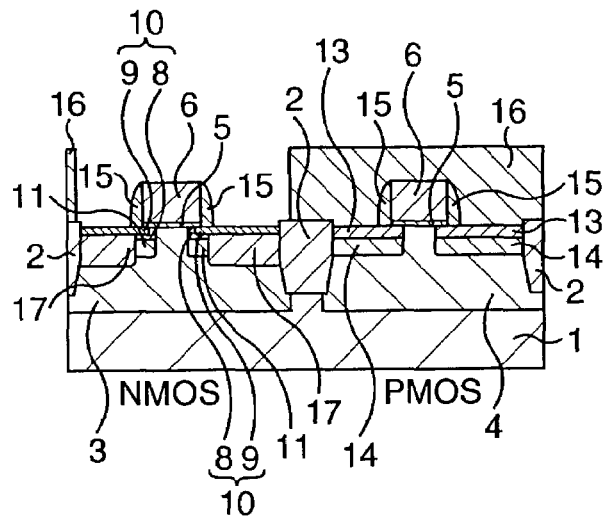

Subsequently, as shown in FIG. 3G, a source/drain is formed in the p-type channel/well region 3 alone as a deep junction region.

To be more specific, a resist pattern 16 is formed by processing to cover only the n-type channel/well region 4 again, and a high concentration of an n-type impurity, that is, arsenic herein, is doped into the surface layer of the semiconductor substrate 1 on either side of the sidewall 15 by ion implantation using the resist pattern 16 and the gate electrode 6 and its sidewall 15 on the p-type channel/well region 3 as a mask. Consequently, a source/drain 17 that partially overlaps the extension region 10 and the pocket layer 11 is formed (the extension region 10, the pocket layer 11, and the source/drain 17 together form a first impurity diffusion layer). According to the steps thus far, an NMOS transistor including the gate electrode 6, the first impurity diffusion layer, etc. is fabricated in the p-type channel/well region 3.

Figure 3H:
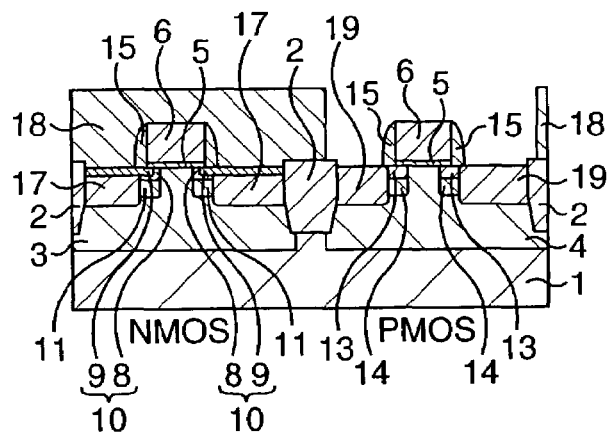

Subsequently, after the resist pattern 16 is removed by ashing or the like, as shown in FIG. 3H, a source/drain is formed in the n-type channel/well region 4 alone as a deep junction region.

To be more specific, a resist pattern 18 is formed by processing to cover only the p-type channel/well region 3 again, and a high concentration of a p-type impurity, that is, boron herein, is doped into the surface layer of the semiconductor substrate 1 on either side of the sidewall 15 by ion implantation using the resist pattern 18 and the gate electrode 6 and its sidewall 15 on the n-type channel/well region 4 as a mask. Consequently, a source/drain 19 that partially overlaps the extension region 13 and the pocket layer 14 is formed (the extension region 13, the pocket layer 14, and the source/drain 19 together form a second impurity diffusion layer). According to the steps thus far, a PMOS transistor including the gate electrode 6, the second impurity diffusion layer, etc. is fabricated in the n-type channel/well region 4.

Figure 3I:
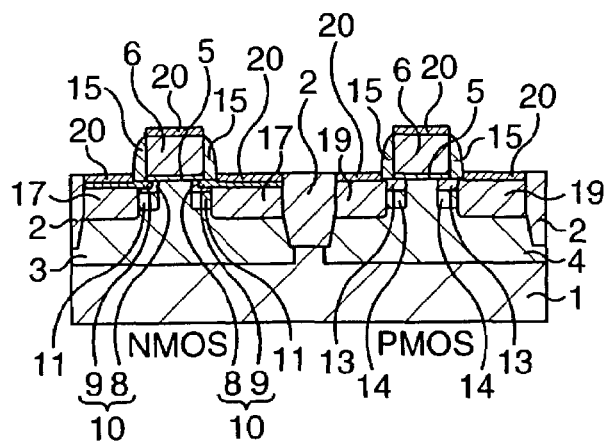

Subsequently, after the resist pattern 18 is removed by ashing or the like, as shown in FIG. 3I, a salicide structure is formed in both the NMOS transistor and the PMOS transistor.

To be more specific, a film of metal that is able to form silicide, that is, cobalt (Co) herein, is sputtered on the entire surface by the sputtering method or the like, and a reaction is allowed to take place between the Co film and silicon on the surfaces of the gate electrodes 6, the sources/drains 17 and 19, and the extension regions 10 and 13 by heat treatment, whereby a cobalt silicide film 20 is formed. Then, the unreacted Co film is removed by predetermined wet etching. Ni, V, Pd, Pt, Cr, or the like may be used as metal that is able to form silicide besides Co.

Subsequently, an interlayer insulation film, a contact hole, various wiring layers, etc. are formed, whereby a CMOS transistor is completed.

As has been explained, according to the present embodiment, with a CMOS transistor, it is possible to prevent unwanted creeping of silicide that occurs often in the shallow junction region depending on a concentration of an impurity having a low diffusion coefficient as represented by arsenic, and further, not only can the resistance in the shallow junction region be lowered, but also an amount of overlaps can be optimized in each of the NMOS transistor and the PMOS transistor.

(Second Embodiment)

Next, an explanation will be given to a second embodiment. Herein, a CMOS transistor having a so-called double-sidewall structure plus the salicide structure will be used as an example of the semiconductor device. For ease of explanation, a structure of the CMOS transistor will be described in parallel with a manufacturing method thereof, and like components are labeled with like reference numerals with respect to the first embodiment above.

FIGS. 4A through 4J are schematic cross sections showing a fabrication sequence in the manufacturing method of the CMOS transistor according to the second embodiment.

Figure 4A:
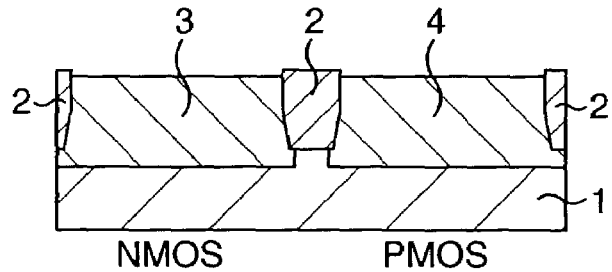
FIGS. 4A through 4J are schematic cross sections showing a fabrication sequence in a manufacturing method of a CMOS transistor according to a second embodiment.

As shown in FIG. 4A, the manufacturing of the CMOS transistor starts with the formation of trenches in a p-type semiconductor substrate 1 by patterning an isolation region, and a silicon oxide film is deposited on the entire surface by the CVD method in a film thickness sufficient to bury the trenches, after which the surface layer of the silicon oxide film is polished by the chemical mechanical polishing method (CMP method), whereby STI isolation structures 2 are formed by filling the trenches with the silicon oxide film. Consequently, active regions are defined.

Subsequently, the active region on the left side of the STI isolation structure 2 at the center in FIG. 4A is made into a p-type channel/well region 3 by doping a p-type impurity, that is, boron (B) herein, by ion implantation, and the active region on the right side is made into an n-type channel/well region 4 by doping an n-type impurity, that is, phosphorus (P) herein. In the following steps, an NMOS transistor and a PMOS transistor are fabricated in the p-type channel/well region 3 and the n-type channel/well region 4, respectively.

Figure 4B:
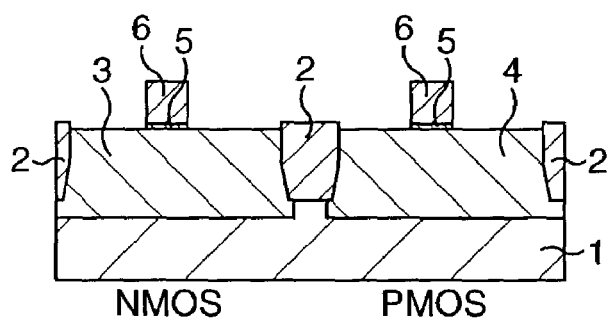

Then, as shown in FIG. 4B, a gate insulation film 5 is formed over the p-type channel/well region 3 and the n-type channel/well region 4 by, for example, thermal oxidation, and a polycrystalline silicon film is deposited on the entire surface by the CVD method, after which the polycrystalline silicon film and the gate insulation film 5 are patterned, whereby a gate electrode 6 is formed on each of the p-type channel/well region 3 and the n-type channel/well region 4 with the gate insulation film 5 being interposed therebetween.

Figure 4C:
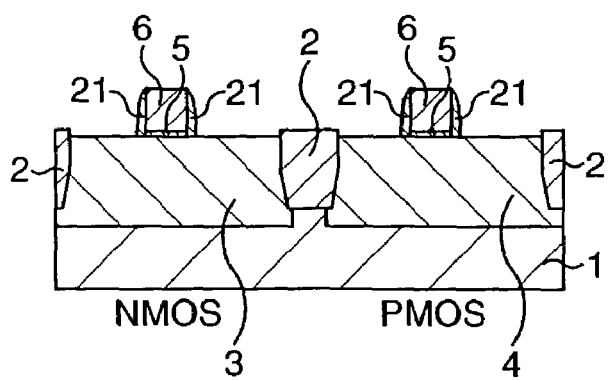

Subsequently, as shown in FIG. 4C, a silicon oxide film is deposited on the entire surface by the CVD method to cover each gate electrode 6, and the entire silicon oxide film is subjected to anisotropic etching (etched back) so that the silicon oxide film is left only on the side face of each gate electrode 6, whereby first sidewalls 21 are formed.

Figure 4D:
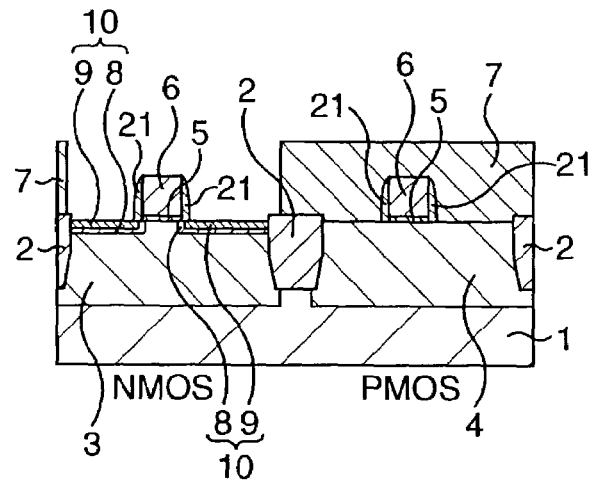
Figure 4E:
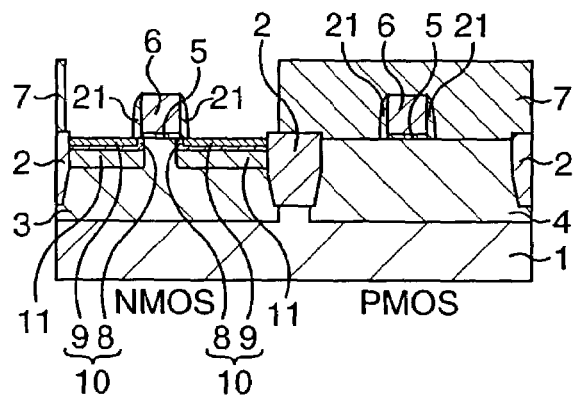

Then, as shown in FIGS. 4D and 4E, a shallow junction region and its pocket layer are formed in the p-type channel/well region 3 alone.

To be more specific, as shown in FIG. 4D, a resist pattern 7 is formed by processing to cover only the n-type channel/well region 4, and a junction layer 8 is formed by doping a high concentration of an n-type impurity, that is, arsenic (As) herein, into the surface layer of the semiconductor substrate 1 on either side of the first sidewall 21 by ion implantation using the resist pattern 7 and the gate electrode 6 and its first sidewall 21 on the p-type channel/well region 3 as a mask. The ion implantation conditions for arsenic at this point may be as follows: the acceleration energy is 5 keV, and a dose is within the above-specified appropriate range.

Then, a junction layer 9 is formed by doping, in succession to the ion implantation of arsenic, a low concentration of an n-type impurity, that is, phosphorus (P) herein, by ion implantation using the resist pattern 7 and the gate electrode 6 and its first sidewall 21 as a mask again to compensate for a further higher n-type impurity concentration. The ion implantation conditions for phosphorus at this point may be as follows: the acceleration energy is 1 keV, and a dose is $5 \times 10^{13}$ ions/cm$^2$. By performing the ion implantation twice in this manner, the junction layer 9 overlaps the junction layer 8, whereby a shallow junction region (extension region) 10 adjusted to have a desired high concentration is formed.

Then, as shown in FIG. 4E, a pocket layer 11 is formed by doping a p-type impurity, that is, boron (B) or indium (In) herein, by ion implantation using the resist pattern 7 and the gate electrode 6 and its first sidewall 21 as a mask once again. At this point, the ion implantation is performed with a tilt angle of 0° or in a slanting direction with respect to a direction perpendicular to the surface of the semiconductor substrate 1.

Figure 4F:
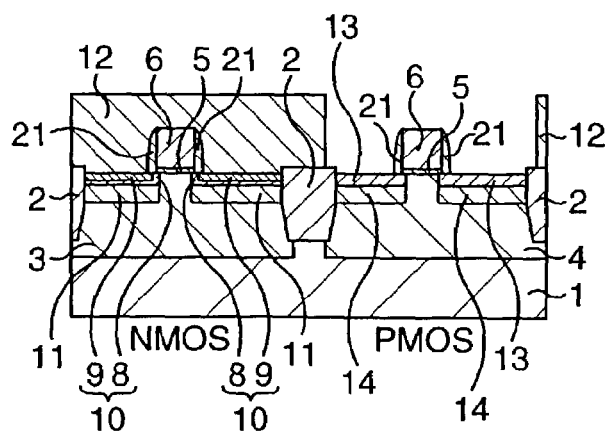

Subsequently, after the resist pattern 7 is removed by ashing or the like, as shown in FIG. 4F, a shallow junction region and its pocket layer are formed next in the n-type channel/well region 4 alone.

To be more specific, a resist pattern 12 is formed by processing to cover only the p-type channel/well region 3, and a high concentration of a p-type impurity, that is, boron herein, is doped into the surface layer of the semiconductor substrate 1 on either side of the first sidewall 21 by ion implantation using the resist pattern 12 and the gate electrode 6 and its first sidewall 21 on the n-type channel/well region 4 as a mask. Consequently, an extension region 13 is formed.

Then, a pocket layer 14 is formed by doping an n-type impurity, that is, arsenic herein, by ion implantation using the resist pattern 12 and the gate electrode 6 and its first sidewall 21 as a mask again. At this point, the ion implantation is performed with a tilt angle of 0° or in a slanting direction with respect to a direction perpendicular to the surface of the semiconductor substrate 1.

Figure 4G:
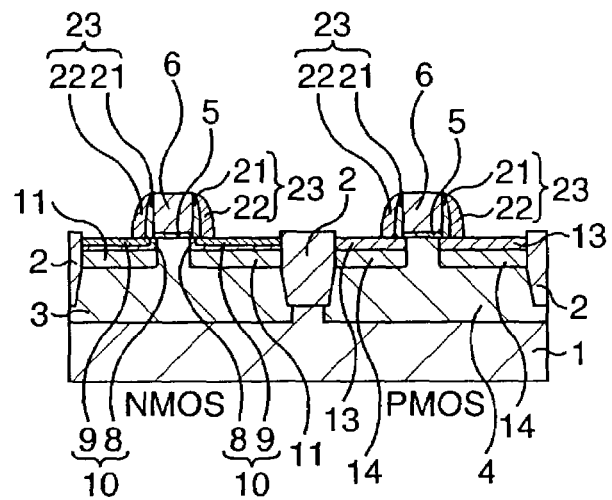

Subsequently, after the resist pattern 12 is removed by ashing or the like, as shown in FIG. 4G, a silicon oxide film is deposited on the entire surface by the CVD method to cover each gate electrode 6, and the entire silicon oxide film is subjected to anisotropic etching (etched back) so that the silicon oxide film is left only on the side face of each first sidewall 21, whereby second sidewalls 22 are formed. At this point, a double-sidewall structure 23 including the first and second sidewalls 21 and 22 is formed on the side face of each gate electrode 6.

Figure 4H:
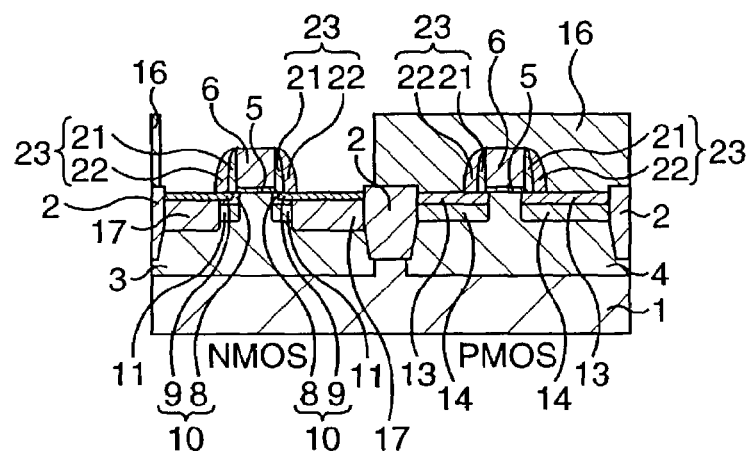

Subsequently, as shown in FIG. 4H, a source/drain is formed in the p-type channel/well region 3 alone as a deep junction region.

To be more specific, a resist pattern 16 is formed by processing to cover only the n-type channel/well region 4 again, and a high concentration of an n-type impurity, that is, arsenic herein, is doped into the surface layer of the semiconductor substrate 1 on either side of the double-sidewall structure 23 by ion implantation using the resist pattern 16 and the gate electrode 6 and its double-sidewall structure 23 on the p-type channel/well region 3 as a mask. Consequently, a source/drain 17 that partially overlaps the extension region 10 and the pocket layer 11 is formed (the extension region 10, the pocket layer 11, and the source/drain 17 together form a first impurity diffusion layer). According to the steps thus far, an NMOS transistor including the gate electrode 6, the first impurity diffusion layer, etc. is fabricated in the p-type channel/well region 3.

Figure 4I:
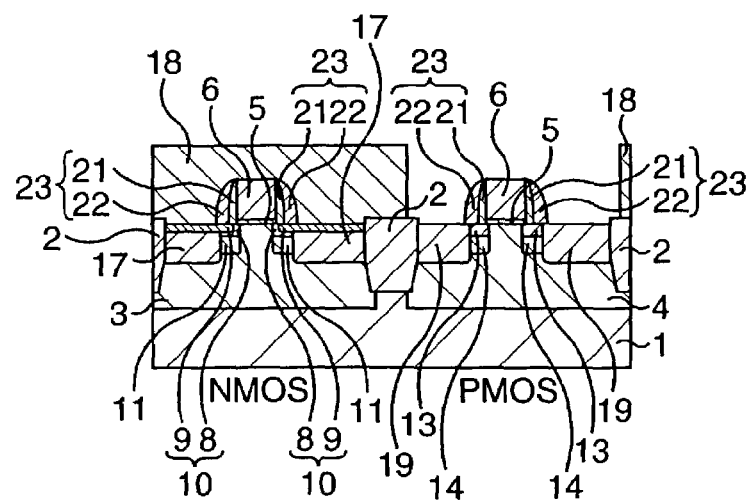

Subsequently, after the resist pattern 16 is removed by ashing or the like, as shown in FIG. 4I, a source/drain is formed in the n-type channel/well region 4 alone as a deep junction region.

To be more specific, a resist pattern 18 is formed by processing to cover only the p-type channel/well region 3 again, and a high concentration of a p-type impurity, that is, boron herein, is doped into the surface layer of the semiconductor substrate 1 on either side of the double-sidewall structure 23 by ion implantation using the resist pattern 18 and the gate electrode 6 and its double-sidewall structure 23 on the n-type channel/well region 4 as a mask. Consequently, a source/drain 19 that partially overlaps the extension region 13 and the pocket layer 14 is formed (the extension region 13, the pocket layer 14, and the source/drain 19 together form a second impurity diffusion layer). According to the steps thus far, a PMOS transistor including the gate electrode 6, the second impurity diffusion layer, etc. is fabricated in the n-type channel/well region 4.

Figure 4J:
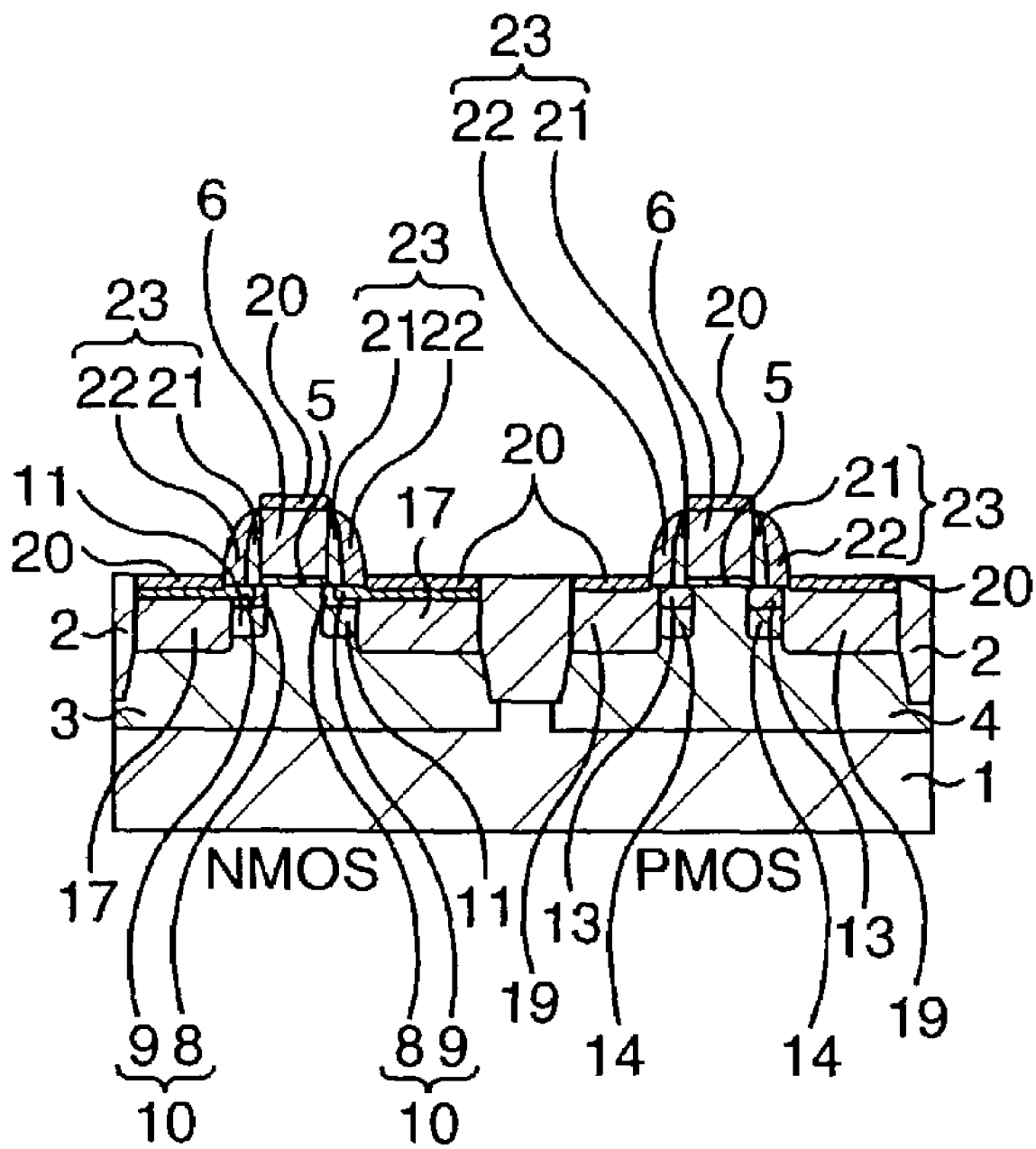

Subsequently, after the resist pattern 18 is removed by ashing or the like, as shown in FIG. 4J, a salicide structure is formed in both the NMOS transistor and the PMOS transistor.

To be more specific, a film of metal that is able to form silicide, that is, cobalt (Co) herein, is sputtered on the entire surface by the sputtering method or the like, and a reaction is allowed to take place between the Co film and silicon on the surfaces of the gate electrodes 6, the sources/drains 17 and 19, and the extension regions 10 and 13 by heat treatment, whereby a cobalt silicide film 20 is formed. Then, the unreacted Co film is removed by predetermined wet etching. Ni, V, Pd, Pt, Cr, or the like may be used as metal that is able to form silicide besides Co.

Subsequently, an interlayer insulation film, a contact hole, various wiring layers, etc. are formed, whereby a CMOS transistor is completed.

As has been explained, according to the present embodiment, with a CMOS transistor, it is possible to prevent unwanted creeping of silicide that occurs often in the shallow junction region depending on a concentration of an impurity having a low diffusion coefficient as represented by arsenic, and further, not only can the resistance in the shallow junction region be lowered, but also an amount of overlaps can be optimized in each of the NMOS transistor and the PMOS transistor. Moreover, since the double-sidewall structure 23 is formed in the present embodiment as described above, the foregoing advantages can be attained in a more reliable manner.

(Third Embodiment)

Next, an explanation will be given to a third embodiment. Herein, a CMOS transistor having a so-called notch gate structure plus the salicide structure will be used as an example of the semiconductor device. For ease of explanation, a structure of the CMOS transistor will be described in parallel with a manufacturing method thereof, and like components are labeled with like reference numerals with respect to the first embodiment above.

FIGS. 5A through 5I are schematic cross sections showing a fabrication sequence in the manufacturing method of the CMOS transistor according to the third embodiment.

Figure 5A:
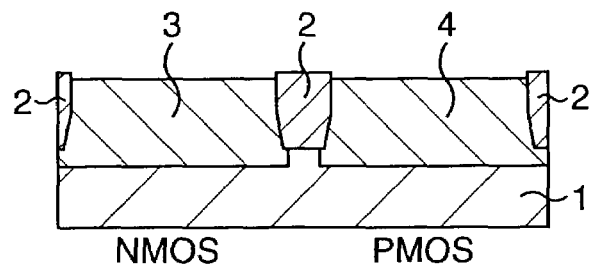

As shown in FIG. 5A, the manufacturing of the CMOS transistor starts with the formation of trenches in a p-type semiconductor substrate 1 by patterning an isolation region, and a silicon oxide film is deposited on the entire surface by the CVD method in a film thickness sufficient to bury the trenches, after which the surface layer of the silicon oxide film is polished by the chemical mechanical polishing method (CMP method), whereby STI isolation structures 2 are formed by filling the trenches with the silicon oxide film. Consequently, active regions are defined.

Subsequently, the active region on the left side of the STI isolation structure 2 at the center in FIG. 5A is made into a p-type channel/well region 3 by doping a p-type impurity, that is, boron (B) herein, by ion implantation, and the active region on the right side is made into an n-type channel/well region 4 by doping an n-type impurity, that is, phosphorus (P) herein. In the following steps, an NMOS transistor and a PMOS transistor are fabricated in the p-type channel/well region 3 and the n-type channel/well region 4, respectively.

Figure 5B:
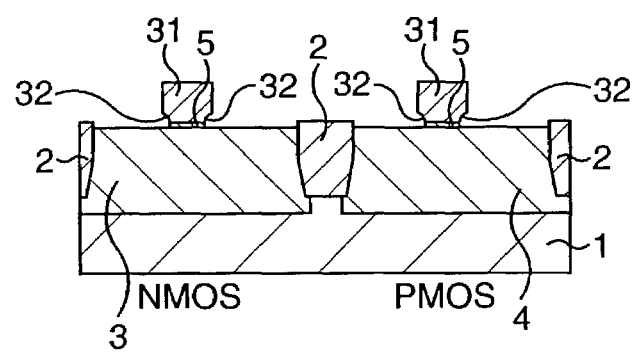

Then, as shown in FIG. 5B, a gate insulation film 5 is formed over the p-type channel/well region 3 and the n-type channel/well region 4 by, for example, thermal oxidation, and a polycrystalline silicon film is deposited on the entire surface by the CVD method, after which the polycrystalline silicon film and the gate insulation film 5 are patterned in the shape of an electrode. Then, only the lower portion of the side face of the polycrystalline silicon film and the gate insulation film 5 thus patterned is subjected to isotropic etching, whereby a gate electrode 31 (notch gate structure) of a notched shape having a narrow width portion 32 at the lower portion of the side face is formed on each of the p-type channel/well region 3 and the n-type channel/well region 4 with the gate insulation film 5 being interposed therebetween.

Figure 5C:
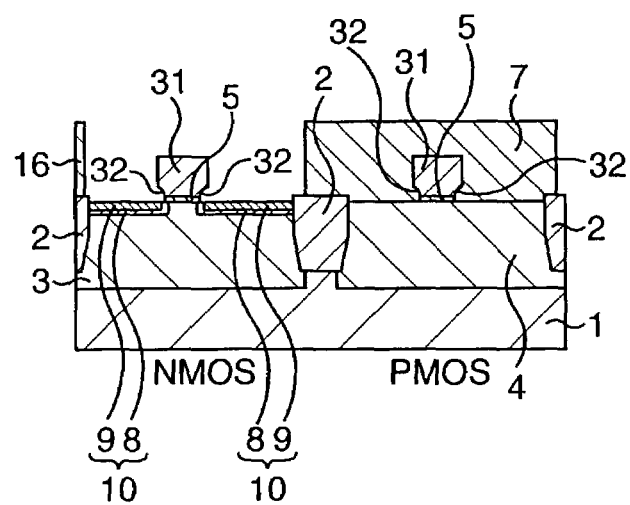
Figure 5D:
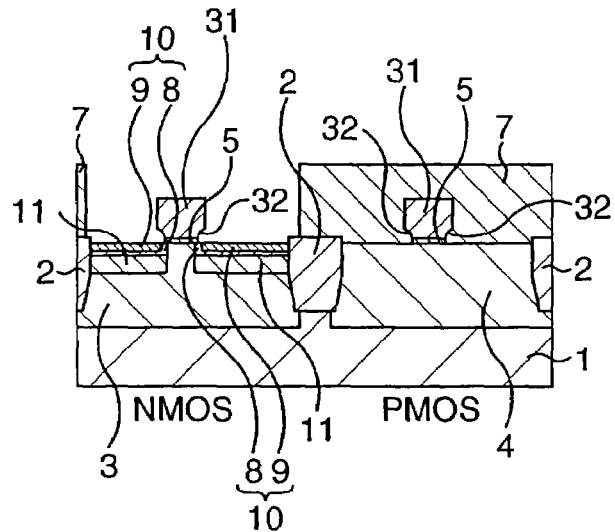

Subsequently, as shown in FIGS. 5C and 5D, a shallow junction region and its pocket layer are formed in the p-type channel/well region 3 alone.

To be more specific, as shown in FIG. 5C, a resist pattern 7 is formed by processing to cover only the n-type channel/well region 4, and a junction layer 8 is formed by doping a high concentration of an n-type impurity, that is, arsenic (As) herein, into the surface layer of the semiconductor substrate 1 on either side of the gate electrode 31 by ion implantation using the resist pattern 7 and the gate electrode 31 on the p-type channel/well region 3 as a mask. The ion implantation conditions for arsenic at this point may be as follows: the acceleration energy is 5 keV, and a dose is within the above-specified appropriate range.

Then, a junction layer 9 is formed by doping, in succession to the ion implantation of arsenic, a low concentration of an n-type impurity, that is, phosphorus (P) herein, by ion implantation using the resist pattern 7 and the gate electrode 31 as a mask again to compensate for a further higher n-type impurity concentration. The ion implantation conditions for phosphorus at this point may be as follows: the acceleration energy is 1 keV, and a dose is $5 \times 10^{13}$ ions/cm$^2$. By performing the ion implantation twice in this manner, the junction layer 9 overlaps the junction layer 8, whereby a shallow junction region (extension region) 10 adjusted to have a desired high concentration is formed.

Then, as shown in FIG. 5D, a pocket layer 11 is formed by doping a p-type impurity, that is, boron (B) or indium (In) herein, by ion implantation using the resist pattern 7 and the gate electrode 31 as a mask once again. At this point, the ion implantation is performed with a tilt angle of 0° or in a slanting direction with respect to a direction perpendicular to the surface of the semiconductor substrate 1.

Figure 5E:
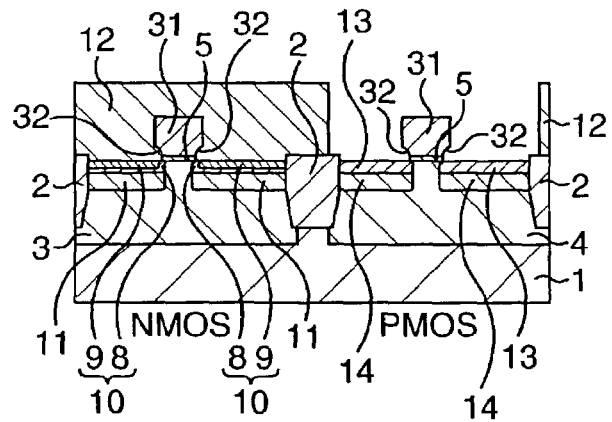

Subsequently, after the resist pattern 7 is removed by ashing or the like, as shown in FIG. 5E, a shallow junction region and its pocket layer are formed next in the n-type channel/well region 4 alone.

To be more specific, a resist pattern 12 is formed by processing to cover only the p-type channel/well region 3, and a high concentration of a p-type impurity, that is, boron herein, is doped into the surface layer of the semiconductor substrate 1 on either side of the gate electrode 31 by ion implantation using the resist pattern 12 and the gate electrode 31 on the n-type channel/well region 4 as a mask. Consequently, an extension region 13 is formed.

Then, a pocket layer 14 is formed by doping an n-type impurity, that is, arsenic herein, by ion implantation using the resist pattern 12 and the gate electrode 31 as a mask again. At this point, the ion implantation is performed with a tilt angle of 0° or in a slanting direction with respect to a direction perpendicular to the surface of the semiconductor substrate 1.

Figure 5F:
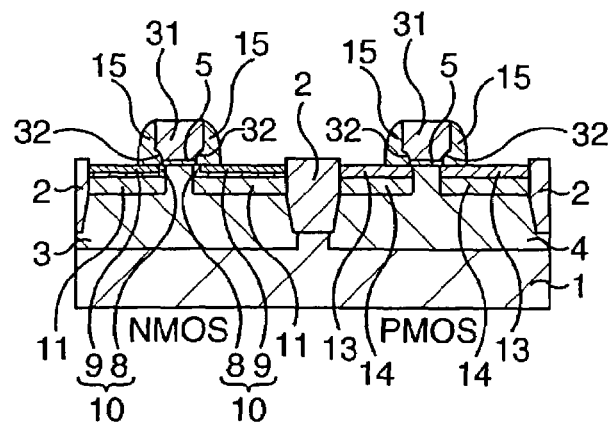

Subsequently, after the resist pattern 12 is removed by ashing or the like, as shown in FIG. 5F, a silicon oxide film is deposited on the entire surface by the CVD method to cover each electrode 31, and the entire silicon oxide film is subjected to anisotropic etching (etched back) so that the silicon oxide film is left only on the side face of each gate electrode 31, whereby sidewalls 15 are formed.

Subsequently, as shown in FIG. 5G, a source/drain is formed in the p-type channel/well region 3 alone as a deep junction region.

To be more specific, a resist pattern 16 is formed by processing to cover only the n-type channel/well region 4 again, and a high concentration of an n-type impurity, that is, arsenic herein, is doped into the surface layer of the semiconductor substrate 1 on either side of the sidewall 15 by ion implantation using the resist pattern 16 and the gate electrode 31 and its sidewall 15 on the p-type channel/well region 3 as a mask. Consequently, a source/drain 17 that partially overlaps the extension region 10 and the pocket layer 11 is formed (the extension region 10, the pocket layer 11, and the source/drain 17 together form a first impurity diffusion layer). According to the steps thus far, an NMOS transistor including the gate electrode 31, the first impurity diffusion layer, etc. is fabricated in the p-type channel/well region 3.

Subsequently, after the resist pattern 16 is removed by ashing or the like, as shown in FIG. 5H, a source/drain is formed in the n-type channel/well region 4 alone as a deep junction region.

To be more specific, a resist pattern 18 is formed by processing to cover only the p-type channel/well region 3 again, and a high concentration of a p-type impurity, that is, boron herein, is doped into the surface layer of the semiconductor substrate 1 on either side of the sidewall 15 by ion implantation using the resist pattern 18 and the gate electrode 31 and its sidewall 15 on the n-type channel/well region 4 as a mask. Consequently, a source/drain 19 that partially overlaps the extension region 13 and the pocket layer 14 is formed (the extension region 13, the pocket layer 14, and the source/drain 19 together form a second impurity diffusion layer). According to the steps thus far, a PMOS transistor including the gate electrode 31, the second impurity diffusion layer, etc. is fabricated in the n-type channel/well region 4.

Subsequently, after the resist pattern 18 is removed by ashing or the like, as shown in FIG. 5I, a salicide structure is formed in both the NMOS transistor and the PMOS transistor.

To be more specific, a film of metal that is able to form silicide, that is, cobalt (Co) herein, is sputtered on the entire surface by the sputtering method or the like, and a reaction is allowed to take place between the Co film and silicon on the surfaces of the gate electrodes 31, the sources/drains 17 and 19, and the extension regions 10 and 13 by heat treatment, whereby a cobalt silicide film 20 is formed. Then, the unreacted Co film is removed by predetermined wet etching. Ni, V, Pd, Pt, Cr, or the like may be used as metal that is able to form silicide besides Co.

Subsequently, an interlayer insulation film, a contact hole, various wiring layers, etc. are formed, whereby a CMOS transistor is completed.

As has been explained, according to the present embodiment, with a CMOS transistor, it is possible to prevent unwanted creeping of silicide that occurs often in the shallow junction region depending on a concentration of an impurity having a low diffusion coefficient as represented by arsenic, and further, not only can the resistance in the shallow junction region be lowered, but also an amount of overlaps can be optimized in each of the NMOS transistor and the PMOS transistor. Moreover, because the notch gate structure is formed in the present embodiment as described above, the foregoing advantages can be attained in a more reliable manner.

According to the present invention, with a semiconductor device of the CMOS structure, it is possible to prevent unwanted creeping of silicide that occurs often in the shallow junction region depending on a concentration of an impurity having a low diffusion coefficient as represented by arsenic, and further, not only can the resistance in the shallow junction region be lowered, but also an amount of overlaps can be optimized in each transistor.

What is claimed is:

1. A semiconductor device, comprising:
a first transistor having a first impurity diffusion layer of a first conduction type formed in such a manner that a shallow junction region and a deep junction region overlap each other at least partially, and having a silicide layer formed at least on a surface of said first impurity diffusion layer, said shallow junction region being formed on said deep junction region;
a second transistor having a second impurity diffusion layer of a second conduction type, said first conduction type and said second conduction type being opposite to each other, and said first transistor and said second transistor comprising a CMOS structure, wherein
a first impurity doped into said shallow junction region in said first impurity diffusion layer has a diffusion coefficient lower than a diffusion coefficient of a second impurity doped into said second impurity diffusion layer, and a dose in said shallow junction region is in a range from $1.1 \times 10^{15}$ to $2 \times 10^{15}$ ions/cm$^2$;
wherein said first transistor further comprises a third impurity diffusion layer of said second conductive type between the first impurity diffusion layer and a channel of said first transistor; and
wherein said third impurity diffusion layer does not underlie the center of a gate electrode.

2. A semiconductor device, comprising:
a first transistor having a first impurity diffusion layer of a first conduction type formed in such a manner that a shallow junction region and a deep junction region overlap each other at least partially, and having a silicide layer formed at least on a surface of said first impurity diffusion layer, said shallow junction region being formed on said deep junction region; and
a second transistor having a second impurity diffusion layer of a second conduction type, said first conduction type and said second conduction type being opposite to each other, and said first transistor and said second transistor comprising a CMOS structure, wherein
said first transistor has a double-sidewall structure including a first sidewall corresponding to said shallow junction region and a second sidewall corresponding to said deep junction region on either side of a gate,
a first impurity doped into said shallow junction region in said first impurity diffusion layer has a diffusion coefficient lower than a diffusion coefficient of a second impurity doped into said second impurity diffusion layer, and a dose in said shallow junction region is in a range from $5 \times 10^{14}$ to $2 \times 10^{15}$ ions/cm$^2$;
wherein said first transistor further comprises a third impurity diffusion layer of said second conductive type between the first impurity diffusion layer and a channel of said first transistor; and
wherein said third impurity diffusion layer does not underlie the center of a gate electrode.

3. A semiconductor device, comprising:
a first transistor having a first impurity diffusion layer of a first conduction type formed in such a manner that a shallow junction region and a deep junction region overlap each other at least partially, and having a silicide layer formed at least on a surface of said first impurity diffusion layer; said shallow junction region being formed on said deep junction region;
a second transistor having a second impurity diffusion layer of a second conduction type, said first conduction type and said second conduction type being opposite to each other, wherein
a gate of said first transistor has a narrow width shape at a lower portion thereof, and
a first impurity doped into said shallow junction region in said first impurity diffusion layer has a diffusion coefficient lower than a diffusion coefficient of a second impurity doped into said second impurity diffusion layer, and a dose in said shallow junction region is in a range from $1.1 \times 10^{15}$ to $2 \times 10^{15}$ ions/cm$^2$;
wherein said first transistor further comprises a third impurity diffusion layer of said second conductive type between the first impurity diffusion layer and a channel of said first transistor; and
wherein said third impurity diffusion layer does not underlie the center of a gate electrode.

4. The semiconductor device according to claim 1, wherein said first impurity is arsenic.

5. The semiconductor device according to claim 1, wherein said second impurity is boron.

6. The semiconductor device according to claim 1, wherein said shallow junction region in said first impurity diffusion layer includes a third impurity of said first conduction type in addition to said first impurity at a concentration lower than the concentration of said first impurity.

7. The semiconductor device according to claim 2, wherein said first impurity is arsenic.

8. The semiconductor device according to claim 2, wherein said second impurity is boron.

9. The semiconductor device according to claim 2, wherein said shallow junction region in said first impurity diffusion layer includes a third impurity of said first conduction type in addition to said first impurity at a concentration lower than the concentration of said first impurity.

10. The semiconductor device according to claim 3, wherein said first impurity is arsenic.

11. The semiconductor device according to claim 3, wherein said second impurity is boron.

12. The semiconductor device according to claim 3, wherein said shallow junction region in said first impurity diffusion layer includes a third impurity of said first conduction type in addition to said first impurity at a concentration lower than the concentration of said first impurity.

13. The semiconductor device according to claim 6, wherein said third impurity is phosphorus.

14. The semiconductor device according to claim 9, wherein said third impurity is phosphorus.

15. The semiconductor device according to claim 12, wherein said third impurity is phosphorus.

16. A semiconductor device, comprising:
- a first transistor having a first impurity diffusion layer of a first conduction type formed in such a manner that a shallow junction region and a deep junction region overlap each other at least partially, and having a silicide layer formed at least on a surface of said first impurity diffusion layer, said shallow junction region being formed on said deep junction region; and
- a second transistor having a second impurity diffusion layer of a second conduction type, said first conduction type and said second conduction type being opposite to each other, and said first transistor and said second transistor comprising a CMOS structure, wherein
- a first impurity of said first conduction type doped into said shallow junction region in said first impurity diffusion layer has a diffusion coefficient lower than a diffusion coefficient of a second impurity of said second conduction type doped into said second impurity diffusion layer, and a dose in said shallow junction region is in a range from $1.1 \times 10^{15}$ to $2 \times 10^{15}$ ions/cm$^2$;
- said shallow junction region in said first impurity diffusion layer contains a third impurity of said first conduction type in addition to said first impurity at a concentration lower than the concentration of said first impurity;
- said first transistor further comprises a third impurity diffusion layer of said second conduction type between the first impurity diffusion layer and a channel of said first transistor; and
- said third impurity diffusion layer does not underlie the center of a gate electrode.

17. A semiconductor device, comprising:
- a first transistor having a first impurity diffusion layer of a first conduction type formed in such a manner that a shallow junction region and a deep junction region overlap each other at least partially, and having a silicide layer formed at least on a surface of said first impurity diffusion layer, said shallow junction region being formed on said deep junction region; and
- a second transistor having a second impurity diffusion layer of a second conduction type, said first conduction type and said second conduction type being opposite to each other, and said first transistor and said second transistor comprising a CMOS structure, wherein
- said first transistor has a double-sidewall structure including a first sidewall corresponding to said shallow junction region and a second sidewall corresponding to said deep junction region on either side of a gate;
- a first impurity of said first conduction type doped into said shallow junction region in said first impurity diffusion layer has a diffusion coefficient lower than a diffusion coefficient of a second impurity of said second conduction type doped into said second impurity diffusion layer, and a dose in said shallow junction region is in a range from $5 \times 10^{14}$ to $2 \times 10^{15}$ ions/cm$^2$;
- said shallow junction region in said first impurity diffusion layer contains a third impurity of said first conduction type in addition to said first impurity at a concentration lower than the concentration of said first impurity;
- said first transistor further comprises a third impurity diffusion layer of said second conduction type between the first impurity diffusion layer and a channel of said first transistor; and
- said third impurity diffusion layer does not underlie the center of a gate electrode.

* * * * *